United States Patent
Furuya et al.

(10) Patent No.: US 7,022,397 B2
(45) Date of Patent: Apr. 4, 2006

(54) BASE FILM FOR MEMBRANE SWITCH AND MEMBRANE SWITCH

(75) Inventors: Koji Furuya, Gifu (JP); Makoto Handa, Gifu (JP)

(73) Assignee: Teijin DuPont Films Japan Limited, Tokyo (JP)

( * ) Notice: Subject to any disclaimer, the term of this patent is extended or adjusted under 35 U.S.C. 154(b) by 0 days.

(21) Appl. No.: 10/496,986

(22) PCT Filed: Sep. 4, 2003

(86) PCT No.: PCT/JP03/11303

§ 371 (c)(1),
(2), (4) Date: May 27, 2004

(87) PCT Pub. No.: WO2004/033540

PCT Pub. Date: Apr. 22, 2004

(65) Prior Publication Data

US 2005/0064140 A1    Mar. 24, 2005

(30) Foreign Application Priority Data

Sep. 5, 2002 (JP) .............................. 2002-259714
Sep. 5, 2002 (JP) .............................. 2002-259715

(51) Int. Cl.
*B32B 3/10* (2006.01)
*B32B 3/22* (2006.01)
*B32B 7/00* (2006.01)
*B32B 27/18* (2006.01)
*B32B 27/36* (2006.01)

(52) U.S. Cl. .................... 428/141; 428/212; 428/332; 428/337; 428/339; 428/480; 428/694 SG; 428/910; 524/115; 524/123; 524/126; 524/147; 524/394; 524/398; 177/136; 177/144; 177/210 R; 280/735; 200/85 R; 200/85 A; 200/512

(58) Field of Classification Search .................... None
See application file for complete search history.

(56) References Cited

U.S. PATENT DOCUMENTS

| | | | | | |
|---|---|---|---|---|---|
| 4,086,208 | A | * | 4/1978 | Murayama et al. ......... | 528/167 |
| 4,254,018 | A | * | 3/1981 | Kowallik et al. ........... | 524/131 |
| 5,656,356 | A | * | 8/1997 | Masuda et al. ............ | 428/141 |
| 5,656,716 | A | * | 8/1997 | Schmidt et al. ............ | 528/279 |
| 5,986,221 | A | * | 11/1999 | Stanley ....................... | 177/136 |
| 6,139,952 | A | * | 10/2000 | Furuya et al. .............. | 428/339 |
| 6,303,210 | B1 | * | 10/2001 | Watanabe et al. ........... | 428/141 |
| 6,346,070 | B1 | * | 2/2002 | Ohmatsuzawa et al. .... | 528/279 |
| 6,355,345 | B1 | * | 3/2002 | Furuya et al. .............. | 428/343 |
| 6,365,659 | B1 | * | 4/2002 | Aoyama et al. ............ | 524/399 |
| 6,372,326 | B1 | * | 4/2002 | Kosuge et al. ............. | 428/141 |
| 6,485,810 | B1 | | 11/2002 | Uchida et al. | |
| 6,541,598 | B1 | * | 4/2003 | Duan et al. ................. | 528/279 |
| 6,617,006 | B1 | * | 9/2003 | Kubo et al. ................ | 428/141 |
| 6,641,900 | B1 | * | 11/2003 | Hebrink et al. ............ | 428/212 |
| 6,670,030 | B1 | * | 12/2003 | Uchida et al. .............. | 428/323 |

FOREIGN PATENT DOCUMENTS

| | | |
|---|---|---|
| EP | 982114 A1 | 3/2000 |
| EP | 1029704 A1 | 8/2000 |
| JP | 62-135350 | 6/1987 |
| JP | 4-75610 | 12/1992 |
| JP | 06-170911 A | 6/1994 |
| JP | 10-321076 A | 12/1998 |
| JP | 2001-347565 A | 12/2001 |
| JP | 2002-254510 A | 9/2002 |
| JP | 2003-113234 | 4/2003 |
| JP | 2003-253017 A | 9/2003 |
| WO | WO 99/37466 | 7/1999 |

* cited by examiner

*Primary Examiner*—Vivian Chen
(74) *Attorney, Agent, or Firm*—Sughrue Mion, PLLC

(57) ABSTRACT

There is provided a membrane switch film comprising polyethylene 2, 6-naphthalenedicarboxylate as the major component and having excellent handling properties and durability, and particularly a film which is suitable for a membrane switch to be used in automobile interior devices which are potentially exposed to high temperature. The film is a membrane switch film having a refractive index in the range of 1.770–1.790 on both surfaces in either or both the film processing direction and the widthwise direction and an absolute value of no greater than 0.015 for the difference between the refractive indexes of both surfaces.

13 Claims, No Drawings

BASE FILM FOR MEMBRANE SWITCH AND MEMBRANE SWITCH

FIELD OF THE INVENTION

The present invention relates to a membrane switch base film composed of a biaxial oriented polyester film comprising polyethylene-2,6-naphthalenedicarboxylate as the major component. More specifically, it relates to a membrane switch base film with excellent handling properties and durability, and especially to a membrane switch base film which is suitable for use in automobile interior devices which are potentially exposed to high temperature.

BACKGROUND ART

A membrane switch comprises two base films lying on either side of a spacer, with contact points (electrodes) corresponding to each of the opposing surfaces. Switching action between conduction and insulation can be easily accomplished by pressing the base films, i.e. varying the spacing between the base films. Membrane switches have recently come into wide use for the keypads of cellular phones or portable personal computers or the various control panel switches of household electrical appliances such as VTRs and microwave ovens.

Because the switching action of a membrane switch involves repeated pressing, the base films used therefor must be flexible and resistant to deformation. Base films used for conventional membrane switches have generally been polyethylene terephthalate (hereinafter also abbreviated as "PET") films because of their deformation resistance, adhesion with electrodes, bonding with printing pastes, and other properties.

Recently, however, membrane switches and remote control switches are becoming more common in the operating panels of automobile-related parts (car audio systems, car air conditioners, car navigation systems and the like). Base films of membrane switches have therefore been required to have deformation resistance at high temperatures that cannot be withstood by PET films. For example, vehicle interior temperatures are known to reach approximately 80° C. during the daytime in summer, and such interior temperatures often exceed the glass transition point (Tg) of PET. When a PET film is used as a membrane switch base film in such an environment, the high temperature burden results in deformation of the PET film which remains even after the burden no longer exists, and such warping of the PET film is a cause of switch malfunction.

As a means of improving this situation, Japanese Examined Patent Publication HEI No. 4-75610 has proposed using as the base films polyethylene naphthalenedicarboxylate (hereinafter also abbreviated as "PEN") films which have a higher glass transition point than PET films. Specifically, Japanese Examined Patent Publication HEI No. 4-75610 discloses a membrane switch having contact points corresponding to each of the opposing surfaces of two base films, which employs as at least one of the base films a biaxial oriented polyethylene naphthalenedicarboxylate film having an F-5 value (5% elongation stress) of $\geqq 11$ kg/mm$^2$, a density of $\leqq 1.375$ g/cm$^3$ and a thermal shrinkage factor of $\leqq 1.0\%$ when heated at 120° C. for 30 minutes.

Also, Japanese Examined Patent Publication HEI No. 6-4276 discloses polyester film for a membrane switch composed of polyethylene naphthalate having a haze increase rate of no greater than 20% as defined by the following formula upon heat treatment at 150° C. for 2 hours:

Haze increase rate=$\{(H2-H1)/H1\}\times 100$ (%)

(where H1 is the haze value before heat treatment and H2 is the haze value after heat treatment), and a thermal shrinkage factor of no greater than 0.5% in both the film processing direction (the direction of propagation of the film during continuous film processing, also referred to as the film longitudinal direction, machine direction, continuous film formation direction or MD direction) and the widthwise direction (the direction orthogonal to the film forming direction within the plane of the film, also referred to as the transverse direction or TD).

DISCLOSURE OF THE INVENTION

Recently, however, more stringent quality has been required for membrane switch base films, and even some PEN films have been inadequate in terms of deformation resistance or durability.

In response to the changing requirements for quality, it has been disclosed in Domestic Republished Application 99/37466 that deformation resistance can be improved by specific heat treatment of PEN films. However, for handling in the processing of the membrane switch by the method described in this publication, there are restrictions on the heat treatment temperature before and after circuit printing. It has therefore been desired to obtain a membrane switch base film which exhibits excellent durability while also having superior handleability in the process.

It is a first object of the present invention to solve the aforementioned problems of the prior art by providing a base film having excellent film handleability and durability, which is particularly suitable for a membrane switch to be used for automobile interior devices which are potentially exposed to high temperatures. It is another object of the invention to provide a membrane switch base film with excellent workability for punching out membrane switch shapes from the film.

Other objects and advantages of the invention will become readily apparent by the following description.

According to the invention, the aforementioned objects and advantages are achieved, firstly, by:

a membrane switch base film composed of a biaxially oriented polyester film comprising polyethylene-2,6-naphthalenedicarboxylate as the major component, the film having a refractive index in the range of 1.770–1.790 on both surfaces in either or both the film processing direction and the widthwise direction and an absolute value of no greater than 0.015 for the difference between the refractive indexes of both surfaces.

According to the invention, the aforementioned objects and advantages are achieved, secondly, by:

a membrane switch base film composed of a biaxially oriented polyester film comprising polyethylene-2,6-naphthalenedicarboxylate as the major component, the film having a melting sub-peak temperature of between 220° C. and 250° C. as measured with a differential scanning calorimeter (DSC) and an absolute value of no greater than 6° C. for the difference between the melting sub-peak temperature on one surface and the melting sub-peak temperature on the other surface.

According to the invention, the aforementioned objects and advantages are achieved, thirdly, by:

a membrane switch base film composed of a biaxially oriented polyester film comprising polyethylene-2,6-naphthalenedicarboxylate as the major component, the film having (1) a refractive index in the range of 1.770–1.790 on both surfaces in either or both the film processing direction and the widthwise direction and an absolute value of no greater than 0.015 for the difference between the refractive indexes of both surfaces, and (2) a melting sub-peak temperature of between 220° C. and 250° C. as measured with a differential scanning calorimeter (DSC) and an absolute value of no greater than 6° C. for the difference between the melting sub-peak temperature on one surface and the melting sub-peak temperature on the other surface.

According to the invention, the aforementioned objects and advantages are achieved, fourthly, by:

a membrane switch comprising a membrane switch base film according to the first, second or third aspect of the invention, a spacer and electrodes.

DETAILED DESCRIPTION OF THE INVENTION

<Polyethylene-2,6-naphthalenedicarboxylate>

The polymer composing the biaxially oriented polyester film of the invention comprises polyethylene-2,6-naphthalenedicarboxylate (hereinafter also abbreviated as "PEN") as the major component, and it may be also be a copolymer or blend. The term "major" as used in the present invention means that ethylene-2,6-naphthalenedicarboxylate constitutes at least 80 mole percent, preferably at least 90 mole percent and more preferably at least 95 mole percent of the total repeating units of the polymer. It is only necessary to guarantee permanent deformation resistance with use under high temperature, without extreme loss of the original properties of the biaxially oriented polyester film of the invention.

In the case of a copolymer, compounds having two ester-forming functional groups in the molecule may be used as the copolymerizing components of the copolymer other than polyethylene-2,6-naphthalenedicarboxylate as the major component. As such compounds there may be used, preferably, dicarboxylic acids such as oxalic acid, adipic acid, phthalic acid, sebacic acid, dodecanedicarboxylic acid, isophthalic acid, terephthalic acid, 1,4-cyclohexanedicarboxylic acid, 4,4'-diphenyldicarboxylic acid, phenylindanedicarboxylic acid, 2,7-naphthalenedicarboxylic acid, tetralindicarboxylic acid, decalindicarboxylic acid and diphenyletherdicarboxylic acid. There may also be suitably used oxycarboxylic acids such as p-oxybenzoic acid and p-oxyethoxybenzoic acid. In addition, there may be suitably used dihydric alcohols such as propylene glycol, trimethylene glycol, tetramethylene glycol, hexamethylene glycol, cyclohexanemethylene glycol, neopentyl glycol, bisphenolsulfone ethylene oxide addition product, bisphenol A ethylene oxide addition product, diethylene glycol and polyethylene oxide glycol.

These compounds may be used alone or in combinations of two or more. Among these compounds are preferred those with isophthalic acid, terephthalic acid, 4,4'-diphenyldicarboxylic acid, 2,7-naphthalenedicarboxylic acid and p-oxybenzoic acid as acid components and trimethylene glycol, hexamethylene glycol, neopentyl glycol and bisphenolsulfone ethylene oxide addition product as glycol components.

The PEN used for the invention may also have terminal hydroxyl and/or carboxyl groups, all or a portion of which are blocked with a monofunctional compound such as benzoic acid or methoxypolyalkylene glycol. Alternatively, the PEN used for the invention may be copolymerized with, for example, a trace amount of a tri- or higher functional ester-forming compound such as glycerin, pentaerythritol or the like, in a range which gives a substantially linear polymer.

The polymer composing the membrane switch base film of the invention may also be, instead of PEN, a blend with other organic polymer. As organic polymers blended with PEN there may be mentioned polyethylene terephthalate, polyethylene isophthalate, polytrimethylene terephthalate, polyethylene-4,4'-tetramethylenediphenyldicarboxylate, polyethylene-2,7-naphthalenedicarboxylate, polytrimethylene-2,6-naphthalenedicarboxylate, polyneopentylene-2,6-naphthalenedicarboxylate, poly(bis(4-ethyleneoxyphenyl) sulfone)-2,6-naphthalenedicarboxylate and the like. Among these, polyethylene isophthalate, polytrimethylene terephthalate, polytrimethylene-2,6-naphthalenedicarboxylate and poly(bis(4-ethyleneoxyphenyl)sulfone)-2,6-naphthalenedicarboxylate are particularly preferred.

These organic polymers to be blended with PEN may be used alone or in combinations of two or more. The proportion of an organic polymer to be blended with PEN may be in the range of no more than 20 mole percent, preferably no more 10 mole percent and more preferably no more than 5 mole percent of the repeating units of the polymer. Production of such a blend can be accomplished by a commonly known process for production of polyester composition.

The polyester which is comprised by the base film according to the invention may be obtained by a publicly known process of the prior art. For example, a low polymerization degree polyester may be obtained directly by reaction between a dicarboxylic acid and glycol, or transesterification of a dicarboxylic acid lower alkyl ester and glycol may be carried out using a publicly known transesterification catalyst of the prior art, followed by polymerization reaction in the presence of a polymerization catalyst.

As examples of transesterification catalysts there may be mentioned compounds containing sodium, potassium, magnesium, calcium, zinc, strontium, titanium, zirconium, manganese and cobalt, of which any one or combination of two or more may be used. As polymerization catalysts there may be mentioned antimony compounds such as antimony trioxide and antimony pentaoxide, germanium compounds such as germanium dioxide, and titanium compounds such as tetraethyl titanate, tetrapropyl titanate, tetraphenyl titanate or their partial hydrolysates, ammonium titanyl oxalate, potassium titanyl oxalate and titanium trisacetylacetonate.

For polymerization via transesterification, a phosphorus compound such as trimethyl phosphate, triethyl phosphate, tri-n-butyl phosphate or orthophosphoric acid may be added in order to inactivate the transesterification catalyst prior to polymerization reaction. The content of such a phosphorus compound is preferably 20–100 ppm by weight in terms of phosphorus element in the PEN, from the standpoint of thermal stability of the polyester. The polyester may be into chips after melt polymerization, then the chips may be polymerized in solid phase with heating under reduced pressure or under an inert gas stream of nitrogen or the like.

The intrinsic viscosity of the polyester comprising PEN as the major component is preferably from 0.40 dl/g to 0.90 dl/g. It is more preferably 0.43–0.85 dl/g and most preferably 0.45–0.80 dl/g. If the intrinsic viscosity is below this limit the film may be brittle, tending to result in tearing of the film during its processing. If the intrinsic viscosity of the film is above this limit, the intrinsic viscosity of the polymer will need to be rather high, and this may require a longer time for polymerization by ordinary synthesis methods and thus impair productivity. The intrinsic viscosity is the value (units: dl/g) measured at 35° C. using o-chlorophenol as the solvent.

<Additives>

The membrane switch film of the invention preferably contains a small proportion of inert particles to provide slipperiness to the film. As examples of such inert particles there may be mentioned inorganic particles such as spherical silica, porous silica, calcium carbonate, alumina, titanium dioxide, kaolin clay, barium sulfate and zeolite, or organic particles such as silicone resin particles and crosslinked polystyrene particles. Inorganic particles are preferably synthetic particles rather than natural particles, because the particle sizes of the former are more uniform. The crystal form, hardness, specific gravity and color of the inorganic particles is not particularly restricted, and may be selected depending on the purpose of use.

As specific inorganic particles there may be mentioned calcium carbonate, porous silica, spherical silica, kaolin, talc, magnesium carbonate, barium carbonate, calcium sulfate, barium sulfate, lithium phosphate, calcium phosphate, magnesium phosphate, aluminum oxide, silicon oxide, titanium oxide, zirconium oxide, lithium fluoride and the like. Particularly preferred among these are calcium carbonate particles, spherical silica particles, porous silica particles and laminar aluminum silicate.

As organic particles there may be mentioned organic salt particles, crosslinked polymer particles and the like. As examples of organic salt particles there may be mentioned calcium oxalate or terephthalic acid salts of calcium, barium, zinc, manganese, magnesium and the like. As examples of crosslinked polymer particles there may be mentioned homopolymers or copolymers of vinyl-based monomers such as divinylbenzene, styrene, acrylic acid and methacrylic acid. There may also be mentioned preferred organic particles such as polytetrafluoroethylene, silicone resins, benzoguanamine resins, thermosetting epoxy resins, unsaturated polyester resins, thermosetting urea resins and thermosetting phenol resins. Particularly preferred among these crosslinked polymer particles are silicone resin particles and crosslinked polystyrene particles.

The particle size of inert particles added to the film is preferably a mean particle size of 0.05–5 μm, more preferably 0.08–3.5 μm and even more preferably 0.10–3 μm for each type of particle. The total amount of inert particles added to the film is preferably 0.05–3 wt %, more preferably 0.08–2.5 wt % and even more preferably 0.1–2.0 wt %.

The inert particles added to the film may consist of one component selected from among those mentioned above, or a plural components, such as two or three components. In the case of a single component, two or more types of particles with different mean particle sizes may be used.

The mean particle size of the inert particles is the value of the particle size corresponding to 50 wt % on a integrating curve for particles having different particle sizes measured using a CP-50 Centrifugal Particle Size Analyzer by Shimazu Corp. and calculated based on a centrifugal sedimentation curve, plotted against their contents (see "Ryudo Sokutei Gijutsu" [Particle Size Measuring Techniques], Nikkan Kogyo Shinbun Co., Ltd., 1975, pp. 242–247).

Most preferably, the base film of the invention comprises from 0.1 wt % to 0.4 wt % of calcium carbonate particles with a mean particle size of 0.3–0.8 μm and/or from 0.03 wt % to 0.5 wt % of spherical silica particles with a mean particle size of 0.1–0.6 μm and/or from 0.03 wt % to 0.4 wt % of silicone particles with a mean particle size of 0.1–0.6 μm. The same type of inert fine particles with different particle sizes may also be used simultaneously, in which case the total content of inert particles of the same type may be within the ranges specified above.

The base film of the invention may also contain a crystal nucleating agent, antioxidant, heat stabilizer, lubricant, flame retardant, antistatic agent, polysiloxane or the like, depending on the purpose of use.

The timing for addition of the inert particles and other additives is not particularly restricted so long as it is at a stage up to processing of the film of the polyester with PEN as the major component, and for example, they may be added at the polymerization stage or during processing of the film. From the viewpoint of achieving uniform dispersion, the inert particles and other additives are preferably added in ethylene glycol and added to a high concentration during polymerization to prepare master chips, and the master chips subsequently diluted with unadded chips.

<Difference Between Melting Sub-Peak Temperatures (Tsm) of Front and Back Sides of Base Film>

The melting sub-peak temperature (Tsm) of the base film of the invention as measured with a differential scanning calorimeter (DSC) must be from 220–250° C. Also, an additional condition is that the absolute value of the difference between the melting sub-peak temperatures (Tsm) of one side (designated as the "front") and the other side (designated as the "back") of the film (|Tsm (front)–Tsm (back)|) must be no greater than 6° C.

If the melting sub-peak temperature is below the lower limit, fine cracks or burrs will tend to be formed at the edges of the film when it is cut into a sheet. On the other hand, if the melting sub-peak temperature is above the upper limit, the film will lose toughness and the durability of the switch will thus be impaired. Also, if the absolute value of the difference between the melting sub-peak temperatures (Tsm) of the front and back sides of the film (|Tsm (front)–Tsm (back)|) is greater than 6° C., fine cracks or burrs will tend to be formed at the edges of the film when it is cut into a sheet, or the film will tend to become curled after being rolled and: stored for a period as a roll.

The melting sub-peak temperature (Tsm) is more preferably from 225° C. to 245° C. and even more preferably from 230° C. to 245° C. The absolute value of the difference between the melting sub-peak temperatures (Tsm) of the front and back sides of the film (|Tsm (front)–Tsm(back)|) is more preferably no greater than 5° C. and even more preferably no greater than 4° C.

<Refractive Index of Base Film>

The refractive index in either or both the film processing direction and the widthwise direction in each plane of the film of the invention must be from 1.770 to 1.790, and more preferably from 1.772 to 1.788. According to the invention, unless otherwise specified, the film processing direction is the direction of propagation of the film during continuous film processing, and it is also referred to as the film longitudinal direction, machine direction, continuous film processing direction or MD direction. Also according to the invention, the widthwise direction is the direction orthogonal to the film processing direction within the plane of the film, and it is also referred to as the transverse direction or TD. If the refractive indexes of the film processing direction and widthwise direction of the film are both below the aforementioned lower limits, the durability of the film will be impaired. On the other hand, if the refractive indexes of the film processing direction and widthwise direction of the film are both above the aforementioned upper limits, the film will tend to tear frequently during its production. The refractive index of the film was measured on both sides using a laser refractometer (measuring wavelength: 633 nm) based on the Abbe refractometer principle.

<Difference Between Refractive Indexes of Front and Back Sides of Base Film>

The absolute value of the difference between the refractive index of one side (designated as the "front") and the refractive index of the other side (designated as the "back") of the film (|refractive index (front)−refractive index (back)|) must be no greater than 0.015 in at least one direction of the base film of the invention in which the refractive index is from 1.770 to 1.790. The absolute value is more preferably no greater than 0.013 and even more preferably no greater than 0.011. If the absolute value of the difference between the refractive indexes of the front and back sides of the film exceeds 0.015 in at least one direction in which the refractive index is from 1.770 to 1.790, fine cracks or burrs will tend to be formed at the edges of the film when it is cut into a sheet, or the film will tend to become curled after being rolled and stored for a period as a roll.

<Refractive Index in Widthwise Direction of Base Film>

The refractive index in the widthwise direction on each side of the base film of the invention is preferably from 1.770 to 1.790, and more preferably from 1.772 to 1.788. The refractive index was measured on each side using a laser refractometer (measuring wavelength: 633 nm) based on the Abbe refractometer principle. If the refractive index in the widthwise direction of the film is below the aforementioned lower limit, the durability of the film may be impaired. On the other hand, if the refractive index of the film is above the upper limit, the film will tend to tear frequently during its production.

<Phosphorus Compound and Titanium Compound in Base Film>

As mentioned above, the base film of the invention preferably contains a phosphorus compound. As suitable phosphorus compounds there may be mentioned phosphoric acid, phosphorus acid, phosphonic acid, phosphonate compounds and their derivatives, of which any one alone or combination of two or more may be used. Preferred among phosphorus compounds are phosphonate compounds represented by the following formula (I).

$R^1O\text{—}C(O)\text{—}X\text{—}P(O)\text{—}(OR^2)_2$     (I)

where $R^1$ and $R^2$ represent $C_{1-4}$ alkyl groups and X represents —$CH_2$— or —CH(Y)— (where Y represents phenyl), and $R^1$ and $R^2$ may be the same or different.

Particularly preferred phosphorus compounds include dimethyl esters, diethyl esters, dipropyl esters and dibutyl esters of carbomethoxymethanephosphonic acid, carboethoxymethanephosphonic acid, carbopropoxymethanephosphonic acid, carbobutoxymethanephosphonic acid, carbomethoxy-phosphono-phenylacetic acid, carboethoxy-phosphono-phenylacetic acid, carbopropoxy-phosphono-phenylacetic acid and carbobutoxy-phosphono-phenylacetic acid.

These phosphonate compounds are preferred according to the invention because they promote reaction with titanium compounds more smoothly than phosphorus compounds which are commonly used as stabilizers, and because they lengthen the duration of the catalytic activity of titanium compounds so that a smaller amount thereof may be added to catalyze the polyester, while the thermal stability of the polyester is not impaired as easily even with a large amount of stabilizer added to the catalyst.

The timing for addition of the phosphorus compound may be as desired so long as it is after the transesterification reaction has substantially been completed, and for example, the phosphorus compound may be added at atmospheric pressure before start of the polycondensation reaction, under reduced pressure after start of the polycondensation reaction, during the final stage of the polycondensation reaction or after completion of the polycondensation reaction, i.e. after obtaining the polymer.

According to the invention, the catalyst used for production of the PEN is preferably a titanium compound which is substantially soluble in PEN, from the standpoint of minimizing contaminants from the catalyst. Specifically, the contents of antimony element or germanium element originating in an antimony compound or germanium compound commonly used as a catalyst in the prior art is preferably a maximum of 5 mmol % based on the number of moles of the ethylene-2,6-naphthalenedicarboxylate component. An antimony element or germanium element content exceeding 5 mmol % result in problems such as precipitation of contaminants from the catalyst.

The titanium compound is not particularly restricted so long as it is soluble in the polymer, and as examples of common titanium compounds as polyester polycondensation catalysts there may be mentioned titanium acetate, tetra-n-butoxytitanium, and the like. Among these, compounds represented by the following formula (II) or reaction products of compounds represented by formula (II) and aromatic polyvalent carboxylic acids represented by the following formula (III) or their anhydrides, are preferred.

$Ti(OR^3)(OR^4)(OR^5)(OR^6)$     (II)

where $R^3$, $R^4$, $R^5$ and $R^6$ each represent $C_{2-10}$ alkyl and/or phenyl.

(III)

where n represents an integer of 2 to 4.

The titanium tetraalkoxides represented by formula (II) above are not particularly restricted so long as $R^3$, $R^4$, $R^5$ and $R^6$ each represent $C_{2-10}$ alkyl and/or phenyl. Particularly preferred titanium tetraalkoxides represented by formula (II) include tetraisopropoxytitanium, tetrapropoxytitanium, tetra-n-butoxytitanium, tetraethoxytitanium, tetraphenoxytitanium, and the like. As aromatic polyvalent carboxylic acids represented by formula (III) there are preferred phthalic acid, trimellitic acid, hemimellitic acid and pyromellitic acid. The aromatic polyvalent carboxylic acids represented by general formula (III) may also be their corresponding anhydrides. For reaction between the titanium-compound and the aromatic polyvalent carboxylic acid, a portion of the aromatic polyvalent carboxylic acid or its anhydride is dissolved in a solvent and the titanium compound is added dropwise thereto for reaction at a temperature of 0–200° C. for 30 minutes or longer.

The content of the titanium compound used as the catalyst is preferably from 4 mmol % to 15 mmol % in terms of titanium element based on the number of moles of the ethylene-2,6-naphthalenedicarboxylic acid. It is more preferably from 6 mmol % to 12 mmol %, and even more preferably from 6 mmol % to 10 mmol %. If the content of the titanium compound is below this lower limit, the PEN productivity will be lower, making it difficult to obtain PEN with the desired molecular weight. If the content of the titanium compound is above the upper limit, the resulting PEN will tend to have lower thermal stability and the molecular weight may be significantly reduced upon melt extrusion during production of the film. The PEN-soluble titanium compound content referred to here is the total of the titanium compound used as the transesterification catalyst and the titanium compound used as the polycondensation catalyst, when the polymerization is conducted via transesterification.

The base film of the invention preferably employs the aforementioned titanium compound as a catalyst in the production stage of the resin composition, and comprises a phosphorus compound as a stabilizer. The contents of the titanium compound and phosphorus compound preferably satisfy the following inequalities (1) to (3) in addition to the conditions stated above.

$$4 \leq Ti \leq 15 \tag{1}$$

$$0.5 \leq P/Ti \leq 15 \tag{2}$$

$$15 \leq Ti+P \leq 150 \tag{3}$$

In inequalities (1) to (3), Ti is the value of the number of moles of titanium element in the titanium compound divided by the number of moles of the ethylene-2,6-naphthalenedicarboxylate component in the composition (mmol %), and P is the value of the number of moles of phosphorus element in the phosphorus compound divided by the number of moles of the ethylene-2,6-naphthalenedicarboxylate component in the composition (mmol %).

If (P/Ti) is below the lower limit, the resulting PEN will tend to have lower thermal stability and heat degradation products will often precipitate around the die slit, resulting in contamination of the slit opening or the peripheral sections of the die. On the other hand, if (P/Ti) is above the upper limit, the reactivity during polymerization of the PEN will be vastly reduced, often making it difficult to obtain PEN with the desired molecular weight. A more preferred range for (P/Ti) is from 2 to 10.

If (Ti+P) is below the lower limit, the productivity may be reduced for film processing based on electrostatic printing, and the uniformity of the film thickness may be impaired. On the other hand, if (Ti+P) is above the upper limit, contaminants from the catalyst may tend to be generated, although in small amounts, and the catalyst-derived contaminants will tend to precipitate around the die slit of the melt extruder during production of the film, causing striped surface defects along the film processing direction. A more preferred range for (Ti+P) is from 25 to 100.

The PEN of the invention may employ 2,6-naphthalenedicarboxylic acid and ethylene glycol as the starting materials, or it may employ a 2,6-naphthalenedicarboxylic acid ester-forming derivative such as 2,6-dimethyl naphthalate and ethylene glycol as the starting materials. Preferred is a production process via transesterification wherein at least 80 mole percent of the total dicarboxylic acid component used as the starting material is 2,6-dimethyl naphthalate. More preferred among production processes using 2,6-dimethyl naphthalate as the starting material is a process wherein at least a portion of the titanium compound is added prior to the start of transesterification, for use as both the transesterification catalyst and the polycondensation catalyst, because this will reduce the amount of titanium compound to be added. The transesterification reaction is preferably carried out under pressurization of from 0.05 MPa to 0.20 MPa in order to further reduce the amount of titanium compound added.

<Thermal Shrinkage>

The thermal shrinkage factor of the base film of the invention in the film processing direction and widthwise direction when it is subjected to heat treatment at 200° C. for 10 minutes is preferably between 0.2% and 1.4%, and more preferably between 0.3% and 1.3%. If the thermal shrinkage factor upon heat treatment at a temperature of 200° C. for 10 minutes is above the upper limit, dimensional variation may increase and the flatness of the film may be impaired by the preheating treatment before working into a membrane switch. On the other hand, if the thermal shrinkage factor is below the lower limit, the durability of the obtained membrane switch may be impaired.

There are no particular restrictions on the difference in thermal shrinkage factor in the film processing direction and widthwise direction (thermal shrinkage factor (MD)–thermal shrinkage factor (TD)) after heat treatment at 200° C. for 10 minutes, but in order to prevent flatness impairment, the difference in thermal shrinkage factor in the film processing direction and the widthwise direction is preferably between −1.0% and 0.5%.

<Base Film Thickness>

The thickness of the membrane switch base film of the invention is preferably from 40 µm to 190 µm, more preferably from 45 µm to 175 µm and even more preferably from 50 µm to 160 µm. If the film thickness is below the lower limit, the durability for repeated pressing may be inadequate. On the other hand, if the film thickness is above the upper limit, the film will be too resistant to flexing for use as a membrane switch.

Variation in the thickness of the film of the invention at any given location is preferably no greater than 10% and more preferably no greater than 8% as compared with the center thickness. A smaller variation in film thickness is more preferable for stable operation of a membrane switch.

<Base Film Roughness (SRa)>

The roughness, and specifically the three-dimensional center plane average roughness (SRa), of the membrane switch base film of the invention on at least one side is preferably from 10 nm to 45 nm. It is more preferably from 10 nm to 40 nm and even more preferably from 12 nm to 35 nm. If the SRa is below the lower limit, films stacked together in large amounts will have poor slipperiness with each other when each film is fed out in order during the switch fabrication process, thus resulting in feed failures. On the other hand, if the SRa is above the upper limit, films stacked together in large amounts will have excessive slipperiness with each other, often resulting in frequent slippage during film stacking.

<Base Film Density>

The density of the base film of the invention is preferably from 1.350 g/cm$^3$ to 1.367 g/cm$^3$. It is more preferably from 1.352 g/cm$^3$ to 1.365 g/cm$^3$ and even more preferably from 1.354 g/cm$^3$ to 1.363 g/cm$^3$. If the density is below the lower limit, the durability for repeated pressing may be impaired. If it is above the upper limit, the crystallinity may be too high, potentially resulting in loss of film toughness and thus poor workability of the membrane switch. The film density is the value as measured by the suspension method at 25° C. in a density gradient tube using aqueous calcium nitrate as the solvent.

<Coating Layer>

The base film of the invention may also be provided with a coating layer on at least one side for the purpose of enhancing adhesion with printing pastes.

The coating layer preferably comprises at least one type of water-soluble or water-dispersible polymer resin selected from among polyester resins, urethane resins, acrylic resins and vinyl-based resins, with combinations of polyester resins and acrylic resins being particularly preferred. A polyester resin in a coating layer used for the invention has a glass transition point (Tg) of 0–100° C. and more preferably 10–90° C. Such a polyester resin is preferably a polyester which is soluble or dispersible in water, but it may also contain some amount of an organic solvent.

Such polyester resins may comprise the following polybasic acids or their ester-forming derivatives and polyols or their ester-forming derivatives. As polybasic acid components there may be mentioned terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, dimer acid, 5-sodiumsulfoisophthalic acid, and the like. Two or more of these acid components may also be used for synthesis of copolymer polyester resins. There may also be used, in slight amounts, unsaturated polybasic acid components such as maleic acid and itaconic acid, or hydroxycarboxylic acids such as p-hydroxybenzoic acid. As polyol components there may be mentioned ethylene glycol, 1,4-butanediol, diethylene glycol, dipropylene glycol, 1,6-hexanediol, 1,4-cyclohexanedimethanol, xylene glycol, dimethylolpropane, poly(ethyleneoxide) glycol, poly(tetramethyleneoxide) glycol, bisphenol A, bisphenol A ethylene oxide or propylene oxide addition products, and the like. The polyester resin used as a coating layer may be formed from such representative monomers, but is not limited thereto.

An acrylic resin in a coating layer used for the invention has a glass transition point (Tg) of −50 to 50° C. and more preferably −50 to 25° C. Such an acrylic resin is preferably an acrylic resin which is soluble or dispersible in water, but it may also contain some amount of an organic solvent. Such acrylic resins may be copolymerized from the following acrylic monomers. As acrylic monomers there may be mentioned alkyl acrylates and alkyl methacrylates (with methyl, ethyl, n-propyl, isopropyl, n-butyl, isobutyl, t-butyl, 2-ethylhexyl, cyclohexyl or the like as alkyl groups); hydroxy group-containing monomers such as 2-hydroxyethyl acrylate, 2-hydroxyethyl methacrylate, 2-hydroxypropyl acrylate and 2-hydroxypropyl methacrylate; epoxy group-containing monomers such as glycidyl acrylate, glycidyl methacrylate and allylglycidyl ether; monomers containing carboxyl groups or their salts, such as acrylic acid, methacrylic acid, itaconic acid, maleic acid, fumaric acid, crotonic acid, styrenesulfonic acid and their salts (sodium salts, potassium salts, ammonium salts, tertiary amine salts and the like); amide-containing monomers such as acrylamide, methacrylamide, N-alkylacrylamide, N-alkylmethacrylamide, N,N-dialkylacrylamide, N,N-dialkyl methacrylate (with methyl, ethyl, n-propyl, isopropyl, n-butyl, isobutyl, t-butyl, 2-ethylhexyl, cyclohexyl or the like as alkyl groups), N-alkoxyacrylamide, N-alkoxymethacrylamide, N,N-dialkoxyacrylamide, N,N-dialkoxymethacrylamide (with methoxy, ethoxy, butoxy, isobutoxy or the like as alkoxy groups), acryloylmorpholine, N-methylolacrylamide, N-methylolmethacrylamide, N-phenylacrylamide and N-phenylmethacrylamide; acid anhydride monomers such as maleic anhydride and itaconic anhydride; and other monomers such as vinyl isocyanate, allyl isocyanate, styrene, α-methylstyrene, vinylmethyl ether, vinylethyl ether, vinyltrialkoxysilane, alkylmaleic acid monoesters, alkylfumaric acid monoesters, alkylitaconic acid monoesters, acrylonitrile, methacrylonitrile, vinylidene chloride, ethylene, propylene, vinyl chloride, vinyl acetate and butadiene. The acrylic resin used as a coating layer is not restricted to those mentioned above.

The above mentioned composition used for the invention is preferably in the form of an aqueous coating liquid such as an aqueous solution, aqueous dispersion or emulsion for formation of the coating. If necessary for formation of the coating, there may also be added other resins in addition to the composition described above, such as oxazoline group-containing polymers, crosslinking agents such as melamine, epoxy or aziridine, antistatic agents, coloring agents, surfactants, ultraviolet absorbers, lubricants (filler, waxes) and the like. A lubricant may be added as necessary for the purpose of enhancing the sliding property or enhancing the blocking resistance of the film.

The solid concentration of the aqueous coating liquid will normally be no greater than 20 wt % and preferably from 1–10 wt %. If the proportion is less than 1 wt %, the polyester film coatability may be inadequate, while if it is above the upper limit, the stability of the coating agent and the coated appearance may be impaired.

The coating layer may be anchored on the film by first applying the aqueous coating liquid onto the unstretched or uniaxially stretched film, and then stretching the film in one or two directions and heat setting it. The application method may be roll coating, gravure coating, roll-brush coating, spraying, air knife coating, impregnation, curtain coating or the like, either alone or in various combinations.

<Production Conditions>

The membrane switch base film of the invention is a biaxially oriented film with PEN as the major component. To obtain a biaxially oriented film, an ordinary method may be employed, for example, for melting at above the melting point of the polymer and extrusion through a die slit onto a casting drum adjusted to near 60° C. to accomplish adhesion, cooling and solidification, and thereby obtain an unstretched film. The unstretched film may then be biaxially stretched in the machine and transverse directions and then heat set and, if necessary, subjected to relaxation treatment in the machine and/or transverse directions. The stretching of the film may be carried out using a publicly known roll-type longitudinal stretching machine, infrared heating longitudinal stretching machine or tenter clip-type transverse stretching machine, or a multistage stretching machine which carries out such stretching in separate multiple stages, a tubular stretching machine, oven-type longitudinal stretching machine or simultaneous biaxial stretching machine, with no particular restriction to these. According to the invention, either sequential biaxial stretching or simultaneous biaxial stretching may be employed, so long as the refractive index can be controlled in the range of 1.770–1.790 in either or both the film processing direction and the widthwise direction.

A process for production of a polyester film of the invention will now be explained in detail, but without placing any restrictions on the invention.

Simultaneous biaxial stretching will be explained first. Simultaneous biaxial stretching machines with a longitudinal stretching mechanism include conventional screw-type machines wherein a clip is mounted in the screw groove and the clip spacing is widened, pantograph-type machines wherein a pantograph is used to widen the clip spacing, and linear motor-type machines which utilize a linear motor. A linear motor-type machine is preferred over a screw-type or pantograph-type machine because the film forming speed is faster and conditions such as the stretching factor can be varied more easily. Simultaneous biaxial stretching offers the advantage of minimal damage to the film surface since no longitudinal stretching rollers are used as are used for sequential biaxial stretching. Another advantage is that it is generally easier to control the orientation in the machine and transverse directions than with sequential biaxial stretching, because the unstretched film is simultaneously stretched in the machine and transverse directions. These features are suited for the properties required of a membrane switch film of the invention, and therefore simultaneous biaxial stretching may be employed for the invention.

According to the invention, simultaneous biaxial stretching refers to stretching for orientation simultaneously in the machine and transverse directions of the film, and it is an operation whereby a simultaneous biaxial stretching machine is used to convey the film while clamping both edges with a clip in order to accomplish stretching in the machine and transverse directions. Needless to mention, it is sufficient if part of the stretching in the machine and transverse directions is carried out simultaneously, and therefore the scope of the invention includes methods in which the film is first stretched in the transverse direction or machine direction and then simultaneously stretched in the machine direction and transverse direction, as well as methods in which simultaneous biaxial stretching is followed by stretching in the transverse direction or machine direction alone.

For production of a film according to the invention, inert particles are added to the prescribed PEN and then a molten film of the PEN which has been melt extruded at a temperature of, for example, 280–330° C. is rapidly cooled on the surface of a rotating cooling drum set to a surface temperature of 30–70° C., to obtain an unstretched film with an intrinsic viscosity of 0.40–0.90 dl/g. The drying prior to melt extrusion is preferably conducted for 4–7 hours at 160–190° C. The ratio of the thickness at the edge and the center of the unstretched film (edge thickness/center thickness) is preferably between 1 and 10, more preferably at least 1 and less than 5 and even more preferably at least 1 and less than 3. A thickness ratio of less than 1 or greater than the upper limit is not preferred as it may increase the incidence of film tearing or clip slipping.

The unstretched film is then guided into a simultaneous biaxial stretching machine with both edges of the film held by the clip and is heated to 80–170° C. in a preheating zone, after which it is subjected to simultaneous biaxial stretching at 120–170° C., in one stage or in two or more stages, to an area increase factor of 9–20 (2–4.5 longitudinally). If necessary, it may be subsequently subjected to simultaneous biaxial stretching in a temperature range of 140–245° C., in one stage or in two or more stages, to an area increase factor of 2–5. Next, the film is heat set in a temperature range of 190–250° C. and if necessary, subjected to relaxation treatment either during the heat setting or in the cooling process after heat setting. The relaxation treatment is preferably conducted in a temperature range of 140–240° C., with relaxation preferably in a range of 1–10% in both the machine and transverse directions. For the membrane switch film of the invention, the preheating temperature is preferably about 130° C., the stretching temperature about 145° C. and the heat setting temperature about 240° C., and if necessary, relaxation treatment is carried out in the machine and transverse directions during the heat setting, after which the film is cooled to room temperature and rolled to obtain the simultaneous biaxial stretched film. According to the invention, the polyester film surface is preferably coated with a coating agent either before or after the simultaneous biaxial stretching in order to impart functions such as adhesive property, sliding property, release property and electrostatic property to the surface of the film.

The film of the invention may also be produced by ordinary sequential biaxial stretching. A PEN unstretched film obtained by a publicly known process as mentioned above may be heated to 80–170° C. in the preheating zone, and then stretched to a factor of 3.0–4.5 and more preferably 3.2–4.2 with an infrared heating-type longitudinal stretching machine in the machine direction at 120–180° C., more preferably 125–170° C. and even more preferably 130–160° C. A roll-type longitudinal stretching machine may also be used, and the stretching is preferably conducted several different times in multistages in order to accomplish non-forced longitudinal stretching. The longitudinal stretching may be followed by transverse stretching and, if necessary, heat setting and relaxation treatment to obtain the desired PEN film.

The transverse stretching is preferably accomplished after further heating to 80–150° C. in a preheating zone after longitudinal stretching, followed by stretching in the transverse direction at 120–180° C. in a stenter, to a factor of 3.0–4.5. A more preferred transverse stretching temperature range is 125–170° C., and especially 130–160° C. A more preferred transverse stretching factor range is from 3.3 to 4.2. The heat setting is preferably carried out at 195–250° C. for 0.3–50 seconds. A more preferred heat setting temperature range is 205–245° C. The heat relaxation treatment is preferably carried out at a temperature of 140–240° C. in the machine direction and/or transverse direction, to a relaxation factor in the range of 0.5–15%. The stretching in the transverse direction may also be conducted several different times in multistages.

According to the production process for a membrane switch base film of the invention as described above (simultaneous biaxial stretching and sequential biaxial stretching), limiting the absolute value of the difference between the melting sub-peak temperatures (Tsm) of the front and back sides of the film (|Tsm (front)−Tsm (back)|) to no greater than 6° C. requires verification and adjustment of the actual heating temperature of the upper surface and lower surface of the film in the heat setting zone. Here, adjustment does not refer merely to setting the temperature to be equal on the upper and lower areas of the heat setting zone.

In the past, only the melting sub-peak temperature of the entire film has been considered important, without concentrating on the actual heat treatment temperature for heat setting on both the front and back sides of the film. According to the invention, however, it has been discovered that in the case of a thick film having a biaxial stretched film thickness of 50 μm or greater, the difference between the melting sub-peak temperatures (Tsm) of the front and back sides of the film has a major influence on the handling properties and workability in the membrane switch production steps, and a solution has been provided for this problem.

In order to limit the refractive index to the range of 1.770–1.790 in either or both the film processing direction and the widthwise direction of the film in the aforementioned production process for a membrane switch base film of the invention (simultaneous biaxially stretching and sequential biaxially stretching), the temperature of the upper surface and lower surface of the film in each preheating zone before longitudinal stretching and transverse stretching may be adjusted to a satisfactory balance. Here, a satisfactory balance means that in considering the temperature difference on the upper surface and lower surface of the film in each stretching zone, the temperature of the upper surface and lower surface of the film in the preheating zone is adjusted so as to allow non-forced stretching across the entire film thickness. Thus, it does not mean simply setting the temperature to be the same at the upper and lower areas of the preheating zone. Although the temperature in the preheating zone has been given little attention in the prior art, the present inventors have found that the temperature in the preheating zone has a major influence on subsequent stretching of thick films particularly having an unstretched film thickness of 700 μm or greater, or a uniaxially stretched film thickness of 300 μm or greater.

As a general range for adjustment of the temperature difference between the upper and lower areas of the preheating zone, the temperature difference between the upper and lower surfaces of the film in the preheating zone is preferably no greater than 8° C., more preferably no greater than 6° C. and even more preferably no greater than 5° C. The temperature in the preheating zone is preferably between 100° C. and 160° C.

In order to adjust the absolute value of the difference in refractive indexes of the front and back sides of the film to within the desired range, the temperature difference between the heat relaxation treatment temperatures in the machine direction and/or transverse direction after heat setting on the upper and lower surfaces of the film may be adjusted to within 12° C., and preferably to within 7° C. For example, if the heat relaxation treatment temperature is set to be slightly higher on the side with the smaller refractive index, when comparing the refractive indexes of the front and back side of the film, the difference in refractive indexes on the front and back sides of the film will tend to be smaller.

The membrane switch base film of the invention obtained in this manner exhibits excellent performance that is resistant to deterioration (due to heat and moisture) in the harsh environments (high-temperature, high-humidity) of automobile interiors. Thus, the film of the invention may be suitably used as a film for automobile interiors which can last for the durable life of the automobile. Mechanism of the property of resistance to such heat and moisture deterioration is associated with extreme orientation in at least one direction.

The membrane switch base film of the invention exhibits excellent deformation recovery after being forcibly deformed for long periods and then released from the deformation, and particularly it exhibits satisfactory deformation recovery even at high temperatures of about 80° C. Thus, even when the film is embedded as a membrane switch base inside the seat face of an automobile seat and subjected to the weight of a sitting passenger, the film recovers from its deformation after the passenger has left the seat, and can consistently function as a normal switch. It is therefore particularly suited as a base material for passenger seat sensor switches. That is, the film of the invention may be suitably used as a membrane switch base film to serve as a sensor which detects when a passenger has sat on a seat, and/or as a sensor for detection of the sitting position by detecting the pressure at different locations of the seat face after a passenger has sat thereon, when a plural of such switches are embedded inside the seat face of each of the seats other than the driver's seat of an automobile. The elastic strength of films with extreme orientation in at least one direction is also associated with expression of such deformation recovery.

EFFECT OF THE INVENTION

The membrane switch base film of the invention has excellent film handling properties and durability. It is particularly suitable for membrane switches used for automobile interior devices which are potentially exposed to high temperature.

EXAMPLES

The present invention will now be explained in greater detail through examples. The property values throughout the examples were measured and evaluated by the methods described below. Unless otherwise specified, the parts and percentages in the examples are parts by weight and percentages by weight.

(1) Measurement of Ethylene-2,6-Naphthalenedicarboxylate Content (Major Component Molar Ratio, Copolymerized Component molar ratio)

The film sample was dissolved in a measuring solvent ($CDCl_3:CF_3COOD=1:1$) and then measured by $^1$H-NMR and the integral ratio of each obtained signal was calculated.

(2) Metal Concentration Analysis

The titanium and phosphorus element concentrations were determined by setting the dried film sample in a scanning electron microscope (SEM, Model S570 by Hitachi Instruments Service Co., Ltd.) and performing quantitative analysis with a connected energy dispersive X-ray microanalyzer (XMA, EMAX-7000 by Horiba Co., Ltd.).

(3) Intrinsic Viscosity (IV)

The intrinsic viscosity (IV) was measured at 35° C. using o-chlorophenol as the solvent.

(4) Film Thickness

A micrometer ("Model K-402B", trade name of Anritsu Corp.) was used for measurement of the film thickness at 10 cm spacings in the lengthwise and widthwise directions of the film, at a total of 300 locations. The average value of the 300 measured film thicknesses was calculated as the overall film thickness.

An electronic micrometer ("Model K-312A", trade name of Anritsu Corp.) was also used for measurement along 2 m lengths in the lengthwise and widthwise directions of the film, with a stylus force of 30 g and a running speed of 25 mm/sec, to obtain a continuous thickness chart. The maximum and minimum thicknesses were read from the chart and combined with the film thickness determined above to calculate the thickness variation according to the following formula.

Thickness variation (%)=((Maximum thickness−minimum thickness)/film thickness)×100

(5) Melting Sub-Peak Temperature (Tsm) and Difference Between Melting Sub-Peak Temperatures (Tsm) on Front and Back Sides One side of the film (front or back side) was sanded with sandpaper (#200) to 20% of the original film thickness. A DSC measuring film sample was taken from the sanded film (front side sample or back side sample), and a DSC220 differential scanning calorimeter by Seiko Instruments, Inc. was used to measure the sub-peak temperature with a temperature elevating rate of 20° C./min and a sample weight of 10 mg under a nitrogen stream.

(6) Film Refractive Index

Using a laser refractometer based on the Abbe refractometer principle, the prism was contacted with each side of the film and the film refractive index was determined in each in-plane direction. Specifically, a prism coupler (Model 2010, by Metricon Corp.) was used to measure the refractive index in the machine direction and the transverse direction (nMD and nTD, respectively) at a wavelength of 633 nm, on the front and back sides of the film. The absolute value of the difference in refractive indexes on the front and back sides was determined in the direction in which the value of the refractive index was between 1.770 and 1.790.

(7) Thermal Shrinkage Factor

The film was held in a tension-free state for 10 minutes in an oven preset to a temperature of 200° C., and the dimensional change before and after heat treatment was calculated from the following formula as the thermal shrinkage factor.

Thermal shrinkage factor %=(L0−L)/(L0)×100

Here, L0 represents the distance between gauge marks before heat treatment, and L represents the distance between gauge marks after heat treatment.

(8) Three-Dimensional Center Plane Average Roughness (SRa)

This was measured using a surface roughness tester ("SURFCOM SE-3CK", trade name of Tokyo Seimitsu Co., Ltd.), according to the method specified in JIS B-0601. Specifically, the peak profile of the film surface was measured under conditions with a measuring length (Lx) of 1 mm, a sampling pitch of 2 μm, a cutoff of 0.25 mm, a thickness direction magnification of 10,000×, a planar magnification of 200× and 100 scanning lines (Ly=0.2 mm), and the surface roughness was calculated.

(9) Film Density

The film density was measured by the suspension method at 25° C. in a density gradient tube, using aqueous calcium nitrate as the solvent.

(10) Film Continuous Film Processing Property

The condition of film processing was observed after continuous processing of the film, and the time until local generation of striped irregularity defects in the film processing direction of the film was measured and evaluated on the following scale. Evaluations of ○ and Δ were judged as acceptable.

○: No generation of striped irregularity defects up to 72 hours after the start of film processing. Very satisfactory continuous film processing property.

Δ: Generation of striped irregularity defects from 36 to 72 hours after the start of film processing. Generally satisfactory continuous film processing property.

x: Generation of striped irregularity defects before 36 hours after the start of film processing. Poor continuous film processing property.

(11) Film Slipperiness

After stacking 400 sheets cut to A4 size from the film and placing them in the tray of a copy machine, 400 continuous copies were made onto OHP sheets, and the slipperiness of film feeding was evaluated on the following scale. Evaluations of ○ and Δ were judged as acceptable.

○: Absolutely no film feeding failures, very satisfactory film slipperiness.

Δ: 1–3 film feeding failures, generally satisfactory film slipperiness.

x: 4 or more feeding failures, problems with film slipperiness.

(12) Film Workability

The film edge condition after punching or cutting was observed and the workability was evaluated on the following scale. Films with evaluations of ○ and Δ were judged as acceptable for use according to the invention.

○: Edges observed with microscope at 100× magnification after cutting and punching. Condition of edges very linear and satisfactory with no disturbances.

Δ: Edges observed with microscope at 100× magnification after cutting and punching. Partial disturbances on edges, but irregularities of the edges could not be felt when stroked with the finger; edge condition generally satisfactory for practical use.

x: Irregularities on edges after cutting and punching could be felt when stroked with the finger; edge condition poor.

(13) Membrane Switch Durability Evaluation

The membrane switch was subjected to a repeated ON/OFF test in an environment at 60° C., 65% RH. A procedure of applying a load to turn the membrane switch ON (initial load: e.g. 1.5 kg/cm$^2$) and then removing the load, for 1 minute each, was repeated. This ON/OFF cycle was continued for 360 hours. Upon completion of the repeated ON/OFF test, the load was removed and the switch was allowed to stand for 30 minutes in an environment at 60° C., 65% RH. The load was then again applied to the switch and the load required to turn the switch ON (post-test load) was measured. The sample was judged as acceptable if the post-test load was at least 90% of the initial load. This test was conducted with n=100 and evaluation was made on the following scale (acceptability).

Acceptability %=(number of samples with post-test load at least 90% of initial load/n number)×100

○: Acceptability of ≧95%, switch durability very satisfactory.

Δ: Acceptability of ≧80%, switch durability generally satisfactory.

x: Acceptability of <80%, switch durability poor.

An evaluation of ○ or Δ was considered having durability necessary for a film of the invention.

(14) Overall Evaluation

The results of the evaluations described above were summarized in an overall evaluation of "◎", "○", "Δ" or "x". Evaluations of "◎"-"Δ" were judged as acceptable, while an evaluation of "x" was judged as unacceptable.

Example 1

Transesterification reaction was carried out according to an ordinary method using 100 parts of dimethyl 2,6-naphthalenedicarboxylate, 60 parts of ethylene glycol and 0.03 part of manganese acetate tetrahydrate as a transesterification catalyst, with addition of 0.25 wt % of calcium carbonate particles with a mean particle size of 0.5 μm, 0.06 wt % of spherical silica particles with a mean particle size of 0.2 μm and 0.1 wt % of spherical silica particles with a mean particle size of 0.1 μm, as lubricants, after which 0.042 part of triethyl phosphonoacetate was added and transesterification was allowed to proceed to substantial completion.

Next, 0.024 part of antimony trioxide was added, and polymerization was conducted by an ordinary method at high temperature and high vacuum to obtain PEN having an intrinsic viscosity of 0.60 dl/g and a Tg of 121° C. The PEN polymer was dried at 175° C. for 5 hours and then supplied to an extruder, melted at a melt temperature of 300° C. and extruded from the die slit, and finally cooled to solidification on a casting drum set to a surface temperature of 55° C. to fabricate an unstretched film.

The unstretched film was stretched to a factor of 3.4 in the machine direction at 140° C. It was then subjected to sequential biaxially stretching to a factor of 3.8 in the transverse direction at 135° C., and immediately subjected to heat setting for 6 seconds in a heat setting zone adjusted to a temperature of 241° C. above the film and to a temperature of 239° C. below the film. The heat setting treatment was followed by 1.5% heat relaxation treatment in the transverse direction to obtain a biaxially oriented film with a thickness of 100 μm, which was then wound up on a roll. The PEN base film was screen printed with silver paste as a conductive circuit and with carbon paste for the printing contacts (electrodes) and dried at 140° C. for 20 minutes to form a switch sheet, after which a film-like styrene-butadiene resin was used as an adhesive for attachment of two of the sheets and a spacer for the membrane switch. The properties, evaluation results and film processing property of the obtained biaxially oriented film and the evaluation results of the membrane switch are shown in Table 1.

Example 2

The same procedure as in Example 1 was repeated, except that the temperature above the film in the heat setting zone was 243° C. and the temperature below the film was 238° C. The properties, evaluation results and film processing property of the obtained biaxially oriented film and the evaluation results of the membrane switch are shown in Table 1.

Example 3

After adding 0.011 part of tetra-n-butyltitanate (TBT) and 0.25 wt % of calcium carbonate particles with a mean particle size of 0.5 μm, 0.06 wt % of spherical silica particles with a mean particle size of 0.25 μm and 0.1 wt % of spherical silica particles with a mean particle size of 0.1 μm, as lubricants, to a mixture of 100 parts of dimethyl 2,6-naphthalenedicarboxylate and 56 parts of ethylene glycol, the mixture was charged into an SUS (stainless steel) vessel suitable for pressure reaction and transesterification was conducted with pressurization at 0.07 MPa and temperature increase from 140° C. to 240° C., after which 0.042 part of triethyl phosphonoacetate (TEPA) was added and transesterification was carried out to completion.

The reaction product was transferred to a polymerization vessel and the temperature was raised to 290° C. for polycondensation reaction in a high vacuum of 100 Pa, to obtain PEN having an intrinsic viscosity of 0.62 dl/g and a Tg of 121° C. The subsequent drying and film processing of the PEN polymer were accomplished by repeating the same procedure as in Example 1. The results are shown in Table 1.

Comparative Example 1

A film was formed in the same manner as Example 1, except that the temperature above the film in the heat setting zone was 220° C. and the temperature below the film was 217° C. The results are shown in Table 1.

Comparative Example 2

A film was formed in the same manner as Example 1, except that the temperature above the film in the heat setting zone was 240° C. and the temperature below the film was 232° C. The results are shown in Table 1.

TABLE 1

| | | | Example 1 | Example 2 | Example 3 | Comp. Ex. 1 | Comp. Ex. 2 |
|---|---|---|---|---|---|---|---|
| Melting sub-peak temperature (Tsm) | Front | ° C. | 241.3 | 243.4 | 241.3 | 219.9 | 240.2 |
| | Back | ° C. | 239.2 | 238.2 | 239.2 | 217.1 | 232.1 |
| | |Front-back| | ° C. | 2.1 | 5.2 | 2.1 | 2.8 | 8.1 |
| Widthwise direction refractive index | | nTD | 1.779 | 1.776 | 1.779 | 1.785 | 1.782 |
| Titanium compound | Type | | — | — | TBT | — | — |
| | Content | mmol % | — | — | 8 | — | — |
| Phosphorus compound | Type | | TEPA | TEPA | TEPA | TEPA | TEPA |
| | Content | mmol % | 48 | 48 | 48 | 48 | 48 |
| P/Ti | Content ratio | | — | — | 6 | — | — |
| Ti + P | Content | mmol % | 48 | 48 | 56 | 48 | 48 |
| Thermal* shrinkage factor 200° C., 10 min | MD | % | 0.6 | 0.4 | 0.6 | 1.3 | 0.8 |
| | TD | % | 1.0 | 0.8 | 1.0 | 1.7 | 1.3 |
| | Intrinsic viscosity | dl/g | 0.60 | 0.60 | 0.62 | 0.63 | 0.63 |
| | Film thickness | μm | 100 | 100 | 100 | 100 | 100 |
| | Film thickness variation | % | 4 | 6 | 4 | 3 | 5 |
| Surface roughness | SRa | nm | 19 | 19 | 21 | 18 | 19 |
| | Density | g/cm³ | 1.359 | 1.360 | 1.359 | 1.353 | 1.357 |
| | Continuous film-processing property | | Δ | Δ | ○ | Δ | Δ |
| | Film workability | | ○ | Δ | ○ | X | X |
| | Switch durability | | ○ | ○ | ○ | Δ | ○ |
| | Overall evaluation | | ○ | Δ | ⊚ | X | X |

Example 4

Transesterification reaction was carried out according to an ordinary method using 100 parts of dimethyl 2,6-naphthalenedicarboxylate, 60 parts of ethylene glycol and 0.03 part of manganese acetate tetrahydrate as a transesterification catalyst, with addition of 0.25 wt % of calcium carbonate particles with a mean particle size of 0.5 μm, 0.06 wt % of spherical silica particles with a mean particle size of 0.2

μm and 0.1 wt % of spherical silica particles with a mean particle size of 0.1 μm, as lubricants, after which 0.042 part of triethyl phosphonoacetate was added and transesterification was allowed to proceed to substantial completion.

Next, 0.024 part of antimony trioxide was added, and polymerization was conducted by an ordinary method at high temperature and high vacuum to obtain PEN having an intrinsic viscosity of 0.63 dl/g and a Tg of 121° C. The PEN polymer was dried at 175° C. for 5 hours and then supplied to an extruder, melted at a melt temperature of 300° C. and extruded from the die slit, and finally cooled to solidification on a casting drum set to a surface temperature of 55° C. to fabricate an unstretched film.

The unstretched film was guided into a preheating zone at 120° C. before longitudinal stretching and heated with a temperature difference of within 4° C. on the upper and lower surfaces of the film, after which it was stretched to a factor of 3.2 in the machine direction at 145° C. It was then guided into a preheating zone at 130° C. before transverse stretching and heated with a temperature difference of within 4° C. on the upper and lower surfaces of the film, after which it was subjected to sequential biaxial stretching to a factor of 3.9 in the transverse direction at 135° C., and immediately subjected to heat setting for 6 seconds with a temperature of 237° C. above and below the film. The heat setting treatment was followed by 1.5% heat relaxation treatment in the transverse direction with a temperature of 215° C. above the film and a temperature of 218° C. below the film, to obtain a biaxially oriented film with a thickness of 100 μm, which was then wound up on a roll.

The PEN base film was screen printed with silver paste as a conductive circuit and with carbon paste for the printing contacts (electrodes) and dried at 140° C. for 20 minutes to form a switch sheet, after which a film-like styrene-butadiene resin was used as an adhesive for attachment of two of the sheets and a spacer for the membrane switch. The properties, evaluation results and film processing property of the obtained biaxially oriented film and the evaluation results of the membrane switch are shown in Table 2.

Example 5

The same procedure as in Example 4 was repeated, except that the temperature above the film for the heat relaxation treatment in the transverse direction after heat setting was 213° C. and the temperature below the film was 221° C. The properties, evaluation results and film processing property of the obtained biaxially oriented film and the evaluation results of the membrane switch are shown in Table 2.

Example 6

After adding 0.011 part of tetra-n-butyltitanate (TBT) and 0.25 wt % of calcium carbonate particles with a mean particle size of 0.5 μm, 0.06 wt % of spherical silica particles with a mean particle size of 0.25 μm and 0.1 wt % of spherical silica particles with a mean particle size of 0.1 μm, as lubricants, to a mixture of 100 parts of dimethyl 2,6-naphthalenedicarboxylate and 56 parts of ethylene glycol, the mixture was charged into an SUS (stainless steel) vessel suitable for pressure reaction and transesterification was conducted with pressurization at 0.07 MPa and temperature increase from 140° C. to 240° C., after which 0.042 part of triethyl phosphonoacetate (TEPA) was added and transesterification was carried out to completion.

The reaction product was transferred to a polymerization vessel and the temperature was raised to 290° C. for polycondensation reaction in a high vacuum of 100 Pa, to obtain PEN having an intrinsic viscosity of 0.61 dl/g and a Tg of 121° C. The subsequent drying and film processing of the PEN polymer were accomplished by repeating the same procedure as in Example 4. The properties, evaluation results and film processing property of the obtained biaxially oriented film and the evaluation results of the membrane switch are shown in Table 2.

Comparative Example 3

The same procedure as in Example 4 was repeated, except that stretching to a factor of 3.3 in the machine direction was followed by stretching to a factor of 3.4 in the transverse direction. The properties, evaluation results and film processing property of the obtained biaxially oriented film and the evaluation results of the membrane switch are shown in Table 2.

Comparative Example 4

The same procedure as in Example 4 was repeated, except that the temperature above the film for the heat relaxation treatment in the transverse direction after heat setting was 225° C. and the temperature below the film was 211° C. The properties, evaluation results and film processing property of the obtained biaxially oriented film and the evaluation results of the membrane switch are shown in Table 2.

Comparative Example 5

The same procedure as in Example 4 was repeated, except that stretching to a factor of 3.0 in the machine direction was followed by stretching to a factor of 4.7 in the transverse direction. However, because of frequent tearing, film processing could not be continuously carried out for more than an hour. As a result, no further evaluation was made of the film properties.

TABLE 2

|  |  | Example 4 | Example 5 | Example 6 | Comp. Ex. 3 | Comp. Ex. 4 | Comp. Ex. 5 |
| --- | --- | --- | --- | --- | --- | --- | --- |
| Widthwise direction refractive index (nTD) | Top side (front) | 1.780 | 1.775 | 1.781 | 1.762 | 1.789 | 1.791 |
|  | Bottom side (back) | 1.785 | 1.787 | 1.784 | 1.764 | 1.772 | 1.795 |
|  | |Front-back| | 0.005 | 0.012 | 0.003 | — | 0.017 | 0.004 |
| Film-processing direction refractive index (nMD) | Top side (front) | 1.738 | 1.738 | 1.740 | 1.758 | 1.733 | 1.730 |
|  | Bottom side (back) | 1.736 | 1.736 | 1.737 | 1.755 | 1.739 | 1.729 |
| Titanium compound | Type | — | — | TBT | — | — | — |
|  | Content  mmol % | — | — | 8 | — | — | — |

TABLE 2-continued

| | | | Example 4 | Example 5 | Example 6 | Comp. Ex. 3 | Comp. Ex. 4 | Comp. Ex. 5 |
|---|---|---|---|---|---|---|---|---|
| Phosphorus compound | Type | | TEPA | TEPA | TEPA | TEPA | TEPA | TEPA |
| | Content | mmol % | 48 | 48 | 48 | 48 | 48 | 48 |
| P/Ti | Content ratio | | | | 6 | | | |
| Ti + P | Content | mmol % | 48 | 48 | 56 | 48 | 48 | 48 |
| Intrinsic viscosity | | dl/g | 0.63 | 0.63 | 0.61 | 0.63 | 0.63 | 0.63 |
| Film thickness | | μm | 100 | 100 | 100 | 100 | 100 | 100 |
| Film thickness variation | | % | 5 | 7 | 5 | 9 | 6 | 3 |
| Surface roughness | SRa | nm | 19 | 19 | 21 | 18 | 19 | 19 |
| Density | | g/cm³ | 1.358 | 1.358 | 1.360 | 1.361 | 1.359 | 1.357 |
| Continuous film-processing property | | | Δ | Δ | ○ | Δ | Δ | X |
| Film slipperiness | | | ○ | ○ | ○ | ○ | ○ | — |
| Film workability | | | ○ | Δ | ○ | ○ | X | — |
| Switch durability | | | ○ | ○ | ○ | X | ○ | — |
| Overall evaluation | | | ○ | Δ | ⊙ | X | X | X |

Example 7

Transesterification reaction was carried out according to an ordinary method using 100 parts of dimethyl 2,6-naphthalenedicarboxylate, 60 parts of ethylene glycol and 0.03 part of manganese acetate tetrahydrate as a transesterification catalyst, with addition of 0.25 wt % of calcium carbonate particles with a mean particle size of 0.5 μm, 0.06 wt % of spherical silica particles with a mean particle size of 0.2 μm and 0.1 wt % of spherical silica particles with a mean particle size of 0.1 μm, as lubricants, after which 0.042 part of triethyl phosphonoacetate was added and transesterification was allowed to proceed to substantial completion.

Next, 0.024 part of antimony trioxide was added, and polymerization was conducted by an ordinary method at high temperature and high vacuum to obtain PEN having an intrinsic viscosity of 0.60 dl/g and a Tg of 121° C. The PEN polymer was dried at 175° C. for 5 hours and then supplied to an extruder, melted at a melt temperature of 300° C. and extruded from the die slit, and finally cooled to solidification on a casting drum set to a surface temperature of 55° C. to fabricate an unstretched film.

The unstretched film was guided into a preheating zone at 120° C. before longitudinal stretching and heated with a temperature difference of within 4° C. on the upper and lower surfaces of the film, after which it was stretched to a factor of 3.2 in the machine direction at 145° C. It was then guided into a preheating zone at 130° C. before transverse stretching and heated with a temperature difference of within 4° C. on the upper and lower surfaces of the film, after which it was subjected to sequential biaxial stretching to a factor of 3.9 in the transverse direction at 135° C., and immediately subjected to heat setting for 6 seconds in a heat setting zone adjusted to a temperature of 241° C. above the film and to a temperature of 239° C. below the film. The heat setting treatment was followed by 1.5% heat relaxation treatment in the transverse direction with a temperature of 215° C. above the film and a temperature of 218° C. below the film, to obtain a biaxially oriented film with a thickness of 100 μm, which was then wound up on a roll.

The PEN base film was screen printed with silver paste as a conductive circuit and with carbon paste for the printing contacts (electrodes) and dried at 140° C. for 20 minutes to form a switch sheet, after which a film-like styrene-butadiene resin was used as an adhesive for attachment of two of the sheets and a spacer for the membrane switch. The properties, evaluation results and film processing property of the obtained biaxially oriented film and the evaluation results of the membrane switch are shown in Table 3.

Example 8

The same procedure as in Example 7 was repeated, except that the temperature above the film in the heat setting zone was 243° C. and the temperature below the film was 238° C. The properties, evaluation results and film processing property of the obtained biaxially oriented film and the evaluation results of the membrane switch are shown in Table 3.

Example 9

After adding 0.011 part of tetra-n-butyltitanate (TBT) and 0.25 wt % of calcium carbonate particles with a mean particle size of 0.5 μm, 0.06 wt % of spherical silica particles with a mean particle size of 0.25 μm and 0.1 wt % of spherical silica particles with a mean particle size of 0.1 μm, as lubricants, to a mixture of 100 parts of dimethyl 2,6-naphthalenedicarboxylate and 56 parts of ethylene glycol, the mixture was charged into an SUS (stainless steel) vessel suitable for pressure reaction and transesterification was conducted with pressurization at 0.07 MPa and temperature increase from 140° C. to 240° C., after which 0.042 part of triethyl phosphonoacetate (TEPA) was added and transesterification was carried out to completion.

The reaction product was transferred to a polymerization vessel and the temperature was raised to 290° C. for polycondensation reaction in a high vacuum of 100 Pa, to obtain PEN having an intrinsic viscosity of 0.62 dl/g and a Tg of 121° C. The subsequent drying and film processing of the PEN polymer were accomplished by repeating the same procedure as in Example 7. The results are shown in Table 3.

TABLE 3

| | | | Example 7 | Example 8 | Example 9 |
|---|---|---|---|---|---|
| Melting sub-peak temperature (Tsm) | Front | ° C. | 241.3 | 243.4 | 241.3 |
| | Back | ° C. | 239.2 | 238.2 | 239.2 |
| | |Front-back| | ° C. | 2.1 | 5.2 | 2.1 |
| Widthwise direction refractive index | Top side (front) | | 1.780 | 1.775 | 1.781 |
| | Bottom side (back) | | 1.785 | 1.787 | 1.784 |
| | |Front-back| | | 0.005 | 0.012 | 0.003 |
| Film-processing direction refractive index (nMD) | Top side (front) | | 1.738 | 1.738 | 1.740 |
| | Bottom side (back) | | 1.736 | 1.736 | 1.737 |

TABLE 3-continued

| | | | Example 7 | Example 8 | Example 9 |
|---|---|---|---|---|---|
| Titanium compound | Type | | — | — | TBT |
| | Content | mmol % | — | — | 8 |
| Phosphorus compound | Type | | TEPA | TEPA | TEPA |
| | Content | mmol % | 48 | 48 | 48 |
| P/Ti | Content ratio | | — | — | 6 |
| Ti + P | Content | mmol % | 48 | 48 | 56 |
| Thermal* shrinkage factor 200° C., 10 min | MD | % | 0.6 | 0.4 | 0.6 |
| | TD | % | 1.0 | 0.8 | 1.0 |
| Intrinsic viscosity | | dl/g | 0.60 | 0.60 | 0.62 |
| Film thickness | | μm | 100 | 100 | 100 |
| Film thickness variation | | % | 4 | 6 | 4 |
| Surface roughness | Sra | Nm | 19 | 19 | 21 |
| | Density | g/cm³ | 1.359 | 1.360 | 1.359 |
| Continuous film-processing property | | | Δ | Δ | ○ |
| Film slipperiness | | | ○ | ○ | ○ |
| Film workability | | | ○ | Δ | ○ |
| Switch durability | | | ○ | ○ | ○ |
| Overall evaluation | | | ○ | Δ | ⊚ |

We claim:

1. A membrane switch base film composed of a biaxially oriented polyester film comprising polyethylene-2,6-naphthalenedicarboxylate as the major component, said film being characterized by having a refractive index in the range of 1.770–1.790 on both surfaces in either or both the film processing direction and the widthwise direction and an absolute value of no greater than 0.015 for the difference between the refractive indexes of both surfaces.

2. A membrane switch base film as claimed in claim 1, further being characterized as having a melting sub-peak temperature of between 220° C. and 250° C. as measured with a differential scanning calorimeter (DSC) and an absolute value of no greater than 6° C. for the difference between the melting sub-peak temperature on one surface and the melting sub-peak temperature on the other surface.

3. A membrane switch base film according to any one of claim 1 or 2, wherein the refractive index of the film in the widthwise direction is from 1.770 to 1.790.

4. A membrane switch base film according to any one of claim 1 or 2 comprising a phosphorus compound and a titanium compound which is soluble in the polyethylene-2,6-naphthalenedicarboxylate, wherein the contents of the titanium compound and phosphorus compound satisfy the following inequalities (1) to (3):

$$4 \leq Ti \leq 15 \quad (1)$$

$$0.5 \leq P/Ti \leq 15 \quad (2)$$

$$15 \leq Ti+P \leq 150 \quad (3)$$

(wherein Ti is the value of the number of moles of titanium element in the titanium compound divided by the number of moles of the ethylene-2,6-naphthalenedicarboxylate component (mmol %), and P is the number of moles of phosphorus element in the phosphorus compound divided by the number of moles of the ethylene-2,6-naphthalenedicarboxylate component (mmol %)).

5. A membrane switch base film according to claim 4, wherein the phosphorus compound is a phosphonate compound represented by the following formula (I):

$$R^1O-C(O)-X-P(O)-(OR^2)_2 \quad (I)$$

(wherein $R^1$ and $R^2$ represent $C_{1-4}$ alkyl groups and X represents $-CH_2-$ or $-CH(Y)-$ (where Y represents phenyl)).

6. A membrane switch base film according to claim 4, wherein the titanium compound is a compound represented by the following formula (II) or the reaction product of a compound represented by formula (II) and an aromatic polyvalent carboxylic acid represented by the following formula (III):

$$Ti(OR^3)(OR^4)(OR^5)(OR^6) \quad (II)$$

(wherein $R^3$, $R^4$, $R^5$ and $R^6$ each independently represent $C_{2-10}$ alkyl groups and/or phenyl):

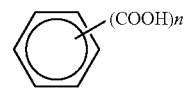

(III)

(wherein n represents an integer of 2 to 4).

7. A membrane switch base film according to any one of claim 1 or 2, wherein the thickness is from 40 μm to 190 μm.

8. A membrane switch base film according to any one of claim 1 or 2, wherein the surface roughness (SRa) of at least one surface is from 10 nm to 45 nm.

9. A membrane switch base film according to any one of claim 1 or 2, wherein the thermal shrinkage factor in the film processing direction and widthwise direction when it is subjected to heat treatment at 200° C. for 10 minutes is between 0.2% and 1.4%.

10. A membrane switch base film according to any one of claim 1 or 2, which is used in an automobile interior.

11. A membrane switch base film according to claim 10, wherein the membrane switch is used as a sensor in each seat in an automobile to detect when a passenger has sat thereon, with a plural of such switches being embedded inside each seat face.

12. A membrane switch base film according to claim 10, wherein the membrane switch is used as a sensor for detection of the sitting position by detecting the pressure at different locations of the seat face of each seat in an automobile after a passenger has sat thereon, with a plural of such switches being embedded inside the seat face of each seat.

13. A membrane switch characterized by comprising a membrane switch base film according to any one of claim 1 or 2, a spacer and electrodes.

* * * * *